(12) United States Patent
Takahashi et al.

(10) Patent No.: US 9,121,911 B2
(45) Date of Patent: Sep. 1, 2015

(54) DEGRADATION DETERMINATION DEVICE AND DEGRADATION DETERMINATION METHOD FOR LITHIUM ION SECONDARY BATTERY

(75) Inventors: Kenji Takahashi, Toyota (JP); Yuji Nishi, Nagoya (JP); Shuji Tomura, Nagoya (JP); Nobuyasu Haga, Seto (JP); Tetsuya Fuchimoto, Nagoya (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 562 days.

(21) Appl. No.: 13/640,551

(22) PCT Filed: Apr. 12, 2011

(86) PCT No.: PCT/IB2011/000805
§ 371 (c)(1),
(2), (4) Date: Dec. 26, 2012

(87) PCT Pub. No.: WO2011/128756
PCT Pub. Date: Oct. 20, 2011

(65) Prior Publication Data
US 2013/0099794 A1 Apr. 25, 2013

(30) Foreign Application Priority Data
Apr. 13, 2010 (JP) ................. 2010-092020

(51) Int. Cl.
*G01N 27/416* (2006.01)
*G01R 31/36* (2006.01)
*H01M 10/0525* (2010.01)
*H01M 10/48* (2006.01)

(52) U.S. Cl.
CPC ....... *G01R 31/3634* (2013.01); *H01M 10/0525* (2013.01); *H01M 10/48* (2013.01); *H01M 10/482* (2013.01); *G01R 31/3679* (2013.01); *Y02E 60/122* (2013.01)

(58) Field of Classification Search
USPC .................................. 324/432, 439
See application file for complete search history.

(56) References Cited

U.S. PATENT DOCUMENTS

| 2004/0008031 A1 | 1/2004 | Arai et al. |
| 2013/0030739 A1 | 1/2013 | Takahashi et al. |

FOREIGN PATENT DOCUMENTS

| CN | 102834727 A | 12/2012 |
| EP | 2053414 A2 | 4/2009 |

(Continued)

OTHER PUBLICATIONS

International Search Report and Written Opinion for corresponding International Patent Application No. PCT/IB2011/000805 mailed Sep. 26, 2011.

*Primary Examiner* — Edward Tso
*Assistant Examiner* — Robert Grant
(74) *Attorney, Agent, or Firm* — Sughrue Mion, PLLC

(57) ABSTRACT

A degradation determination device includes: a measuring unit measuring an open-circuit voltage characteristic indicating an open-circuit voltage variation with respect to a lithium ion secondary battery capacity variation; and a determining unit determining a degradation state due to wear and precipitation of lithium using a parameter for identifying the open-circuit voltage characteristic that substantially coincides with the measured open-circuit voltage characteristic. The parameter includes single electrode capacity retention rates expressed by the expressions (I) positive electrode capacity retention rate=degraded positive electrode capacity/initial positive electrode capacity and (II) negative electrode capacity retention rate=degraded negative electrode capacity/initial negative electrode capacity, and a battery capacity variation expressed by the expression (III) battery capacity variation=degraded negative electrode capacity×shift of a negative electrode composition axis with respect to a positive electrode composition axis.

13 Claims, 11 Drawing Sheets

(56) References Cited

FOREIGN PATENT DOCUMENTS

| | | |
|---|---|---|
| EP | 2 107 385 A1 | 10/2009 |
| JP | 2002-243813 A | 8/2002 |
| JP | 2007-123207 A | 5/2007 |
| JP | 2008-058278 A | 3/2008 |
| JP | 2008-059910 A | 3/2008 |
| JP | 2008-241246 A | 10/2008 |
| JP | 2008-243373 A | 10/2008 |
| JP | 2009-063555 A | 3/2009 |
| JP | 2009-080093 A | 4/2009 |
| JP | 2009-199936 A | 9/2009 |
| JP | 2010-060384 A | 3/2010 |

DEGRADATION DETERMINATION DEVICE AND DEGRADATION DETERMINATION METHOD FOR LITHIUM ION SECONDARY BATTERY

BACKGROUND OF THE INVENTION

1. Field of the Invention

The invention relates to a device and method that are able to determine a degradation state of a lithium ion secondary battery, particularly, a precipitation state of lithium.

2. Description of the Related Art

In a technique described in Japanese Patent Application Publication No. 2009-199936 (JP-A-2009499936), a CPU calculates an estimated amount of dendrite precipitated inside a battery pack on the basis of charge and discharge history information that indicates a charge and discharge history of the battery pack.

In a technique described in Japanese Patent Application Publication No. 2009-063555 (JP-A-2009-063555), it is determined whether lithium is precipitated on an electrode on the basis of a change (decrease) in storage capacity of an electrical storage device (lithium secondary battery).

In a technique described in Japanese Patent Application Publication No. 2007-123207 (JP-A-2007-123207), an electrode surface is drilled in the thickness direction by irradiating an ion beam, a scanning ion microscope (SIM) image of an active material layer exposed on the drilled surface is observed, and then the performance of the electrode is evaluated on the basis of the contrast of the active material in the observed SIM image.

In the technique described in JP-A-2007-123207, it is necessary to disassemble a lithium ion secondary battery. On the other hand, in the techniques described in JP-A-2009-199936 and JP-A-2009-063555, it is possible to estimate precipitation of lithium without disassembling a lithium ion secondary battery.

SUMMARY OF INVENTION

The invention provides a technique that is able to determine a degradation state of a lithium ion secondary battery, particularly, a precipitation state of lithium, using a method different from the related art.

A first aspect of the invention provides a degradation determination device that determines a degradation state of a lithium ion secondary battery. The degradation determination device includes: a measuring unit that measures an open-circuit voltage characteristic that indicates a variation in open-circuit voltage with respect to a variation in capacity of the lithium ion secondary battery; and a determining unit that is able to set a parameter for identifying the open-circuit voltage characteristic, and that uses the parameter for identifying the open-circuit voltage characteristic that substantially coincides with the open-circuit voltage characteristic measured by the measuring unit to determine a degradation state due to wear and precipitation of lithium. The parameter includes single electrode capacity retention rates that vary with degradation due to the wear and that are expressed by the mathematical expression (I) the capacity retention rate of a positive electrode equals a capacity of the positive electrode in a degradation state being divided by a capacity of the positive electrode in an initial state and (II) the capacity retention rate of a negative electrode equals a capacity of the negative electrode in a degradation state being divided by a capacity of the negative electrode in an initial state, and a battery capacity variation that varies with degradation due to the wear and the precipitation of lithium and that is expressed by the mathematical expression (III) the battery capacity variation equals a capacity of the negative electrode in a degradation state being multiplied by a shift of a negative electrode composition axis with respect to a positive electrode composition axis.

In addition, in the degradation determination device according to the first aspect, the battery capacity variation may include a first variation that corresponds to degradation due to the wear and a second variation that corresponds to degradation due to the precipitation of lithium, and the determining unit may determine a precipitation state of the lithium using the second variation.

In addition, in the degradation determination device according to the first aspect, the determining unit may limit or prohibit charging of the lithium ion secondary battery in accordance with a precipitation state of the lithium.

In addition, in the degradation determination device according to the first aspect, the determining unit may identify the first variation using a map that indicates a correspondence relationship among the first variation, the capacity retention rate of the positive electrode and the capacity retention rate of the negative electrode. The map may be prepared in advance through an experiment, or the like. Then, because the capacity retention rate is due to only degradation due to wear, when the capacity retention rate may be identified, the first variation corresponding to the capacity retention rate may be identified.

In addition, in the degradation determination device according to the first aspect, the determining unit may identify a value obtained by subtracting the identified first variation from the battery capacity variation as the second variation. When the first variation may be identified, the second variation may be identified. Because the second variation depends on degradation due to precipitation of lithium, when the correspondence relationship between the second variation and the amount of precipitation of lithium is prepared in advance, the amount of precipitation of lithium may be estimated.

In addition, in the degradation determination device according to the first aspect, the determining unit may identify the open-circuit voltage characteristic that has a minimum voltage error and a minimum capacity error with respect to the open-circuit voltage characteristic measured by the measuring unit while varying the parameter. By so doing, the open-circuit voltage characteristic specified by the parameter may be brought close to the open-circuit voltage characteristic measured by the measuring unit as much as possible, and it is possible to improve the accuracy of determining a degradation state due to wear and precipitation of lithium using the parameter.

In addition, in the degradation determination device according to the first aspect, when the voltage error exceeds an allowable range in the case where the voltage error is calculated, the determining unit may determine that precipitated lithium is in process of returning to a state that contributes to a battery reaction.

In addition, in the degradation determination device according to the first aspect, the determining unit may determine the degradation state when the voltage error falls within the allowable range in the case where the voltage error is calculated.

A second aspect of the invention provides a degradation determination method that determines a degradation state of a lithium ion secondary battery. The degradation determination method includes: measuring an open-circuit voltage characteristic that indicates a variation in open-circuit voltage with respect to a variation in capacity of the lithium ion secondary battery; and determining a degradation state due to wear and precipitation of lithium using a parameter for identifying the open-circuit voltage characteristic that substantially coincides with the measured open-circuit voltage characteristic. The parameter includes single electrode capacity retention rates that vary with degradation due to the wear and that are expressed by the mathematical expression (IV) the capacity retention rate of a positive electrode equals a capacity of the positive electrode in a degradation state being divided by a capacity of the positive electrode in an initial state and (V) the capacity retention rate of a negative electrode equals a capacity of the negative electrode in a degradation state being divided by a capacity of the negative electrode in an initial state, and a battery capacity variation that varies with degradation due to the wear and the precipitation of lithium and that is expressed by the mathematical expression (VI) the battery capacity variation equals a capacity of the negative electrode in a degradation state being multiplied by a shift of a negative electrode composition axis with respect to a positive electrode composition axis.

With the degradation determination device according to the first aspect of the invention and the degradation determination method according to the second aspect of the invention, a parameter is set so that the open-circuit voltage characteristic specified by the parameter substantially coincides with the measured open-circuit voltage characteristic, and the parameter is used to determine degradation due to wear and precipitation of lithium. By so doing, it is possible to determine degradation in accordance with an actual battery state (open-circuit voltage characteristic).

BRIEF DESCRIPTION OF DRAWINGS

The features, advantages, and technical and industrial significance of this invention will be described below with reference to the accompanying drawings, in which like numerals denote like elements, and wherein.

DETAILED DESCRIPTION OF EMBODIMENTS

Figure 1:
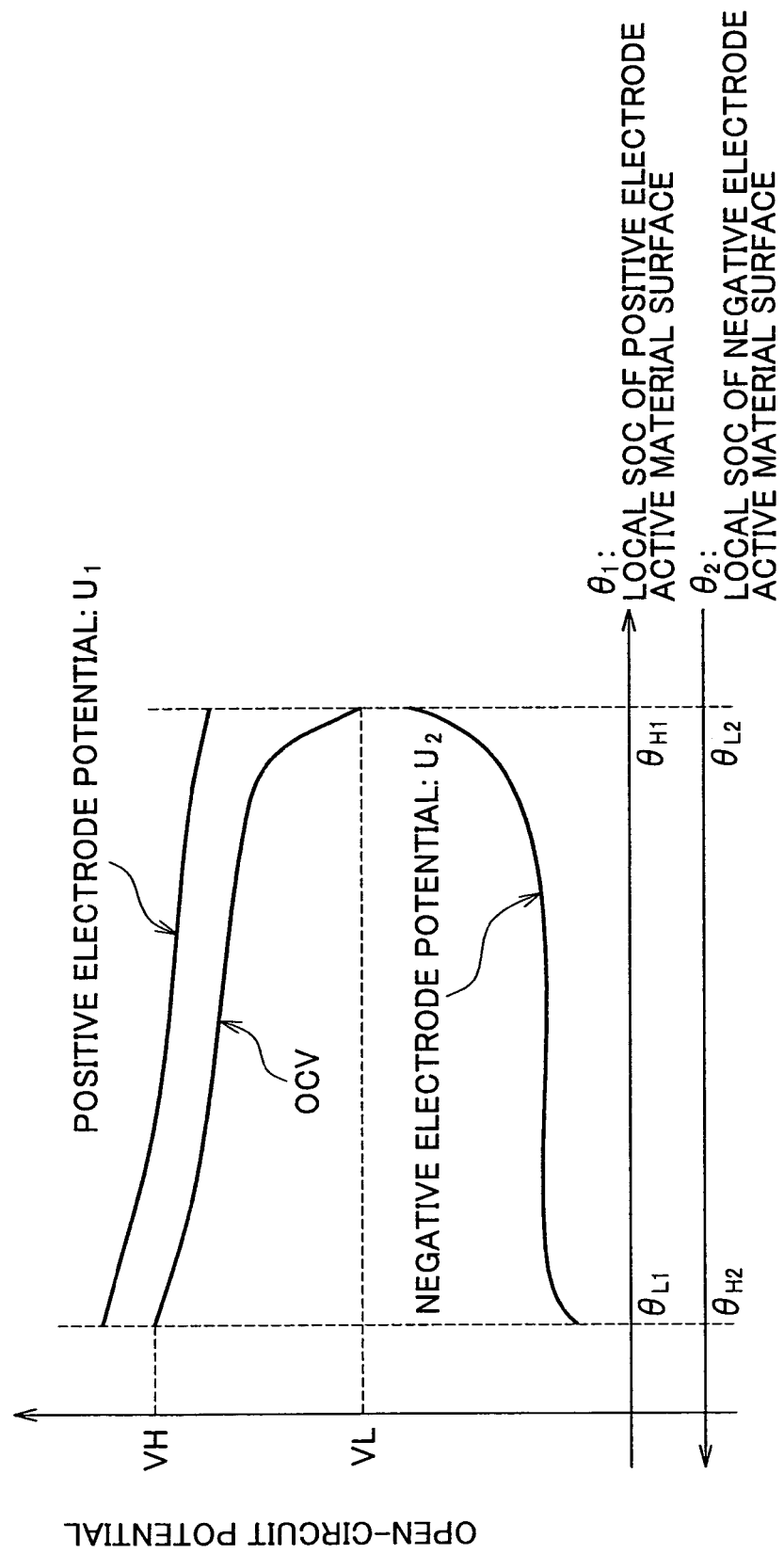
FIG. 1 is a graph that shows the variation characteristic of an open-circuit voltage with respect to a variation in local SOC in a first embodiment of the invention.

Hereinafter, embodiments of the invention will be described.

A first embodiment of the invention will be described. A lithium ion secondary battery is formed of a negative electrode, a separator containing an electrolyte, and a positive electrode. Each of the negative electrode and the positive electrode is formed of an aggregate of spherical active material particles. When the lithium ion secondary battery is discharged, a chemical reaction to emit lithium ions $Li^+$ and electrons $e^-$ occurs on the interface of the active material of the negative electrode. On the other hand, a chemical reaction to absorb lithium ions $Li^+$ and electrons $e^-$ occurs on the interface of the active material of the positive electrode. When the lithium ion secondary battery is charged, a reaction opposite to the above described reaction occurs.

A current collector that absorbs electrons is provided for the negative electrode, and a current collector that emits electrons is provided for the positive electrode. The current collector of the negative electrode is, for example, made of copper, and is connected to a negative electrode terminal. The current collector of the positive electrode is, for example, made of aluminum, and is connected to a positive electrode terminal. Lithium ions are exchanged via the separator between the positive electrode and the negative electrode to thereby charge or discharge the lithium ion secondary battery.

Here, the state of charge inside the lithium ion secondary battery varies depending on the lithium concentration distribution in each of the positive electrode active material and negative electrode active material. The lithium contributes to a reaction that occurs in the lithium ion secondary battery.

The output voltage V of the lithium ion secondary battery is expressed by the following mathematical expression (1).

$$V = OCV(\theta_1, \theta_2) - R \times I \quad (1)$$

Here, in the mathematical expression (1), OCV denotes the open-circuit voltage of the lithium ion secondary battery, R denotes the overall resistance of the lithium ion secondary battery, and I denotes the current that flows in the lithium ion secondary battery. The resistance R includes a pure electrical resistance against transfer of electrons in the negative electrode and the positive electrode and a charge transfer resistance that equivalently acts as an electrical resistance at the time when a reaction current occurs at an active material interface.

In addition, in the mathematical expression (1), $\theta_1$ is a local state of charge (SOC) on the surface of the positive electrode active material, $\theta_2$ is a local SOC on the surface of the negative electrode active material. The resistance R varies with a variation in $\theta_1$, $\theta_2$ or battery temperature. In other words, the resistance R may be expressed as a function of $\theta_1$, $\theta_2$ and battery temperature.

The local SOCs $\theta_1$ and $\theta_2$ are expressed by the following mathematical expression (2).

$$\theta_i = \frac{C_{se,i}}{C_{s,i,max}} \quad (i = 1, 2) \tag{2}$$

Here, in the mathematical expression (2), $C_{se,i}$ denotes a lithium concentration (average value) on the interface of the active material (positive electrode or negative electrode), and $C_{s,i,max}$ is a maximum lithium concentration in the active material (positive electrode or negative electrode). The maximum lithium concentration is an upper limit of lithium concentration in the positive electrode or the negative electrode.

As shown in FIG. 1, the open-circuit voltage OCV of the lithium ion secondary battery is expressed as a potential difference between a positive electrode open-circuit potential $U_1$ and a negative electrode open-circuit potential $U_2$. The positive electrode open-circuit potential $U_1$ varies with the local. SOC $\theta_1$ on the surface of the positive electrode active material, and the negative electrode open-circuit potential $U_2$ varies with the local SOC $\theta_2$ on the surface of the negative electrode active material.

The relationship between the local SOC $\theta_1$ and the positive electrode open-circuit potential $U_1$ is measured when the lithium ion secondary battery is in an initial state. By so doing, the characteristic (curve of $U_1$ shown in FIG. 1) that indicates the relationship between the local SOC $\theta_1$ and the positive electrode open-circuit potential $U_1$ may be obtained. The initial state is a state where the lithium ion secondary battery has not degraded, for example, a state immediately after the lithium ion secondary battery is manufactured.

The relationship between the local SOC $\theta_2$ and the negative electrode open-circuit potential $U_2$ is measured when the lithium ion secondary battery is in the initial state. By so doing, the characteristic (curve of $U_2$ shown in FIG. 1) that indicates the relationship between the local SOC $\theta_2$ and the negative electrode open-circuit potential $U_2$ may be obtained. Data that indicate these characteristics ($U_1$ and $U_2$) may be prestored in a memory as a map.

The open-circuit voltage OCV of the lithium ion secondary battery decreases with the progress of discharge. In addition, a decrease in voltage for a discharge duration increases in the degraded lithium ion secondary battery as compared with the lithium ion secondary battery in the initial state. This indicates that a decrease in full charge capacity and a change in open-circuit voltage characteristic have occurred because of degradation of the lithium ion secondary battery. In the present embodiment, a change in open-circuit voltage characteristic with degradation of the lithium ion secondary battery is modeled as two phenomena that presumably occur inside the lithium ion secondary battery in a degradation state.

The two phenomena are a reduction in single electrode capacity of each of the positive electrode and the negative electrode and a shift in composition correspondence between the positive electrode and the negative electrode.

The reduction in single electrode capacity indicates a reduction in ability of each of the positive electrode and the negative electrode to accept lithium. The reduction in ability to accept lithium means that the active material, and the like, that effectively function to charge or discharge is reduced.

Figure 2:
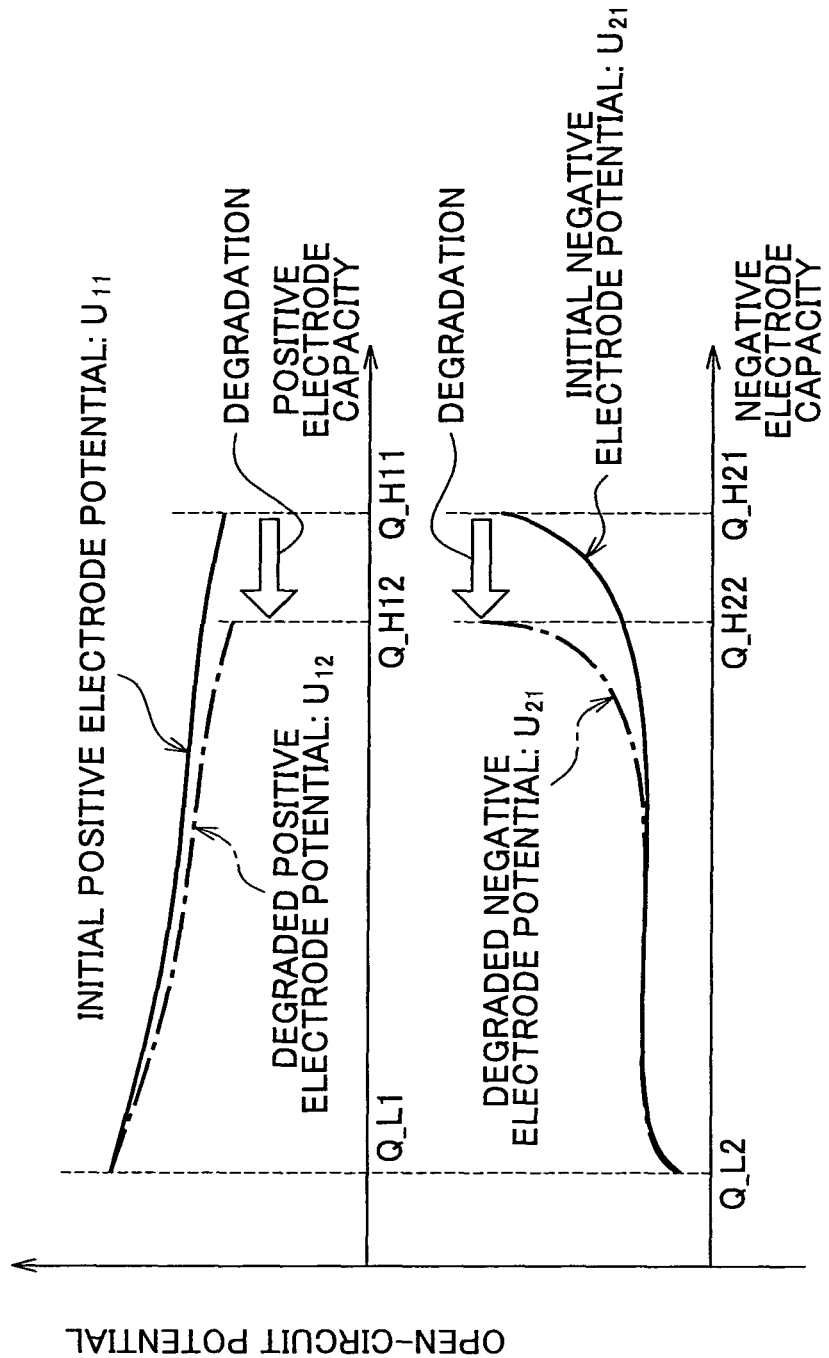
FIG. 2 is a graph that shows a variation in open-circuit potential of a single electrode in accordance with a reduction in single electrode capacity in the first embodiment of the invention.

FIG. 2 schematically shows a variation in single electrode open-circuit potential due to a reduction in single electrode capacity. In FIG. 2, Q_L1 on the axis of the positive electrode capacity is a capacity corresponding to a local SOC $\theta_{L1}$ in FIG. 1 in the initial state of the lithium ion secondary battery. Q_H11 is a capacity corresponding to a local SOC $\theta_{H1}$ in FIG. 1 in the initial state of the lithium ion secondary battery. In addition, Q_L2 on the axis of the negative electrode capacity is a capacity corresponding to a local SOC $\theta_{L2}$ in FIG. 1 in the initial state of the lithium ion secondary battery, and Q_H21 is a capacity corresponding to a local SOC $\theta_{H2}$ in FIG. 1 in the initial state of the lithium ion secondary battery.

In the positive electrode, as the ability to accept lithium decreases, the capacity corresponding to the local SOC $\theta_1$ varies from Q_H11 to Q_H12. In addition, in the negative electrode, as the ability to accept lithium decreases, the capacity corresponding to the local SOC $\theta_2$ varies from Q_H21 to Q_H22.

Here, even when the lithium ion secondary battery degrades, the relationship between the local SOC $\theta_1$ and the positive electrode open-circuit potential $U_1$ (relationship shown in FIG. 1) does not change. Therefore, when the relationship between the local SOC $\theta_1$ and the positive electrode open-circuit potential $U_1$ is converted to the relationship between the positive electrode capacity and the positive electrode open-circuit potential, as shown in FIG. 2, the curve that indicates the relationship between the positive electrode capacity and the positive electrode open-circuit potential shrinks with respect to the curve of the initial state by the amount of degradation of the lithium ion secondary battery.

In addition, when the relationship between the local SOC $\theta_2$ and the negative electrode open-circuit potential $U_2$ is converted to the relationship between the negative electrode capacity and the negative electrode open-circuit potential, as shown in FIG. 2, the curve that indicates the relationship between the negative electrode capacity and the negative electrode open-circuit potential shrinks with respect to the curve of the initial state by the amount of degradation of the lithium ion secondary battery.

Figure 3:
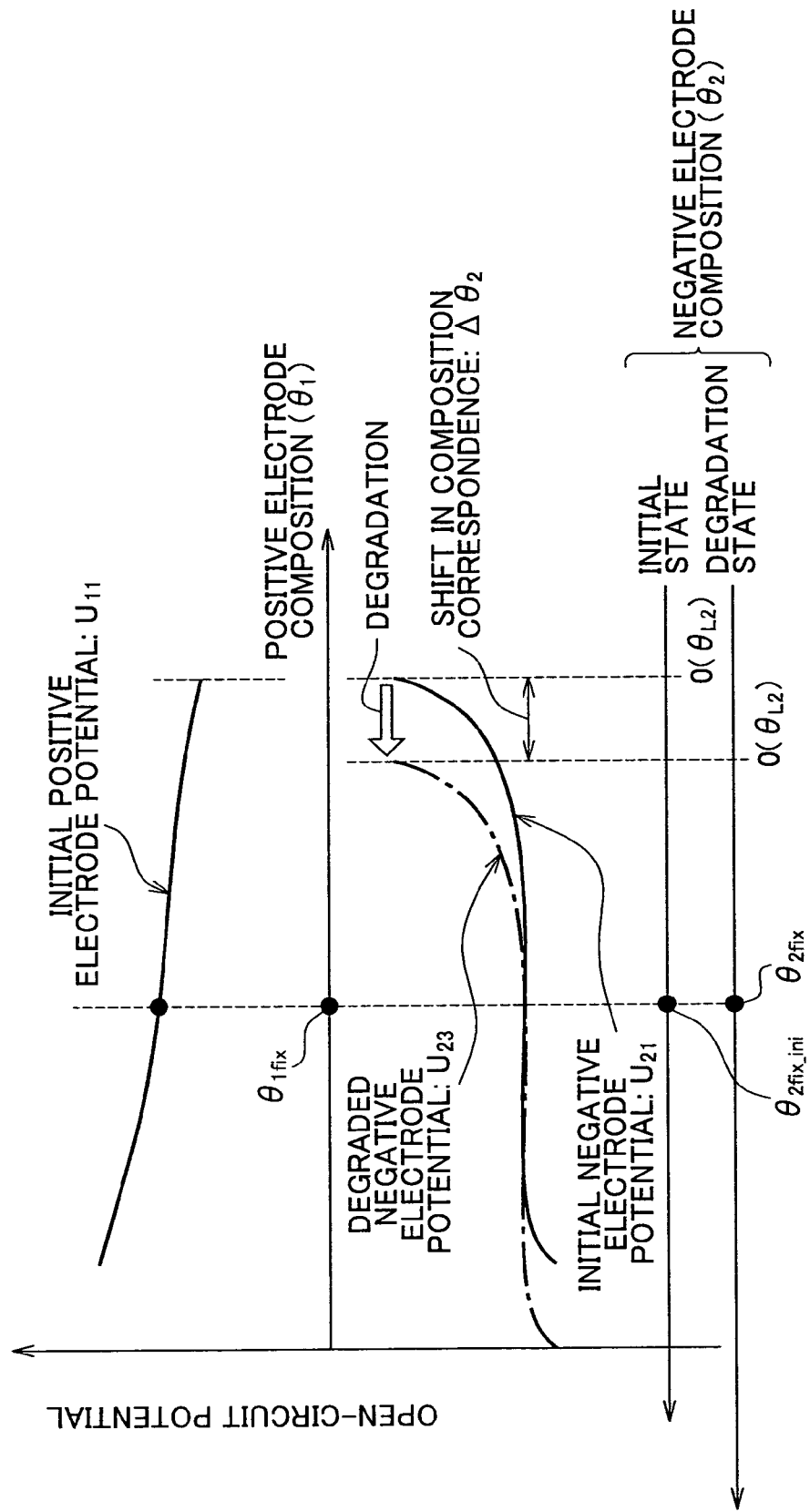
FIG. 3 is a graph that illustrates a shift in composition correspondence between a positive electrode and a negative electrode in the first embodiment of the invention.

FIG. 3 schematically shows a shift in composition correspondence between the positive electrode and the negative electrode. The shift in composition correspondence indicates that, when a set of the positive electrode and the negative electrode is used to carry out charge or discharge, a combination of the positive electrode composition ($\theta_1$) and the negative electrode composition ($\theta_2$) deviates from that of the lithium ion secondary battery in the initial state.

The curve that indicates the relationship between the single electrode composition $\theta_1$ and the open-circuit potential $U_1$ and the curve that indicates the relationship between the single electrode composition $\theta_2$ and the open-circuit potential $U_2$ are the same as the curves shown in FIG. 1. Here, as the lithium ion secondary battery degrades, the axis of the negative electrode composition $\theta_2$ shifts by $\Delta\theta_2$ in the direction in which the positive electrode composition $\theta_1$ reduces. Thus, the curve that indicates the relationship between the negative electrode composition $\theta_2$ and the negative electrode open-circuit potential $U_2$ shifts by $\Delta\theta_2$ from the curve in the initial state in the direction in which the positive electrode composition $\theta_1$ reduces.

The negative electrode composition corresponding to the positive electrode composition $\theta_{1fix}$ is "$\theta_{2fix\_ini}$" when the lithium ion secondary battery is in the initial state, and is "$\theta_{2fix}$" after the lithium ion secondary battery degrades. Note that, in FIG. 3, the negative electrode composition $\theta_{12}$ shown in FIG. 1 is set to 0, and this indicates a state where no lithium is left in the negative electrode.

In the present embodiment, three degradation parameters are introduced into a battery model to thereby model the above described two degradation phenomena. The three degradation parameters are a positive electrode capacity retention rate, a negative electrode capacity retention rate and a shift in correspondence between the positive and negative electrode compositions. A method of modeling the two degradation phenomena will be described below.

The positive electrode capacity retention rate is the ratio of the positive electrode capacity in the degradation state to the positive electrode capacity in the initial state. Here, it is assumed that the positive electrode capacity has reduced by a certain amount from the capacity in the initial state after the lithium ion secondary battery has degraded. At this time, the positive electrode capacity retention rate $k_1$ is expressed by the following mathematical expression (3).

$$k_1 = \frac{Q_{1\_ini} - \Delta Q_1}{Q_{1\_ini}} \quad (3)$$

$$(0 < k_1 < 1)$$

Here, in the mathematical expression (3), $Q_{1\_ini}$ indicates the positive electrode capacity (Q_H11 shown in FIG. 2) when the lithium ion secondary battery is in the initial state, and $\Delta\theta_1$ indicates the amount of reduction in positive electrode capacity when the lithium ion secondary battery is degraded. The positive electrode capacity $Q_{1\_ini}$ may be obtained in advance from the theoretical capacity, prepared amount, or the like, of the active material.

The negative electrode capacity retention rate is the ratio of the negative electrode capacity in the degradation state to the negative electrode capacity in the initial state. Here, it is assumed that the negative electrode capacity has reduced by a certain amount from the capacity in the initial state after the lithium ion secondary battery has degraded. At this time, the negative electrode capacity retention rate $k_2$ is expressed by the following mathematical expression (4).

$$k_2 = \frac{Q_{2\_ini} - \Delta Q_2}{Q_{2\_ini}} \quad (4)$$

$$(0 < k_2 < 1)$$

Here, in the mathematical expression (4), $Q_{2\_ini}$ denotes the negative electrode capacity (Q_H21 in FIG. 2) when the lithium ion secondary battery is in the initial state, and $\Delta\theta_2$ denotes the amount of reduction in negative electrode capacity when the lithium ion secondary battery is degraded. The negative electrode capacity $Q_{2\_ini}$ may be obtained in advance from the theoretical capacity, prepared amount, or the like, of the active material.

Figure 4:
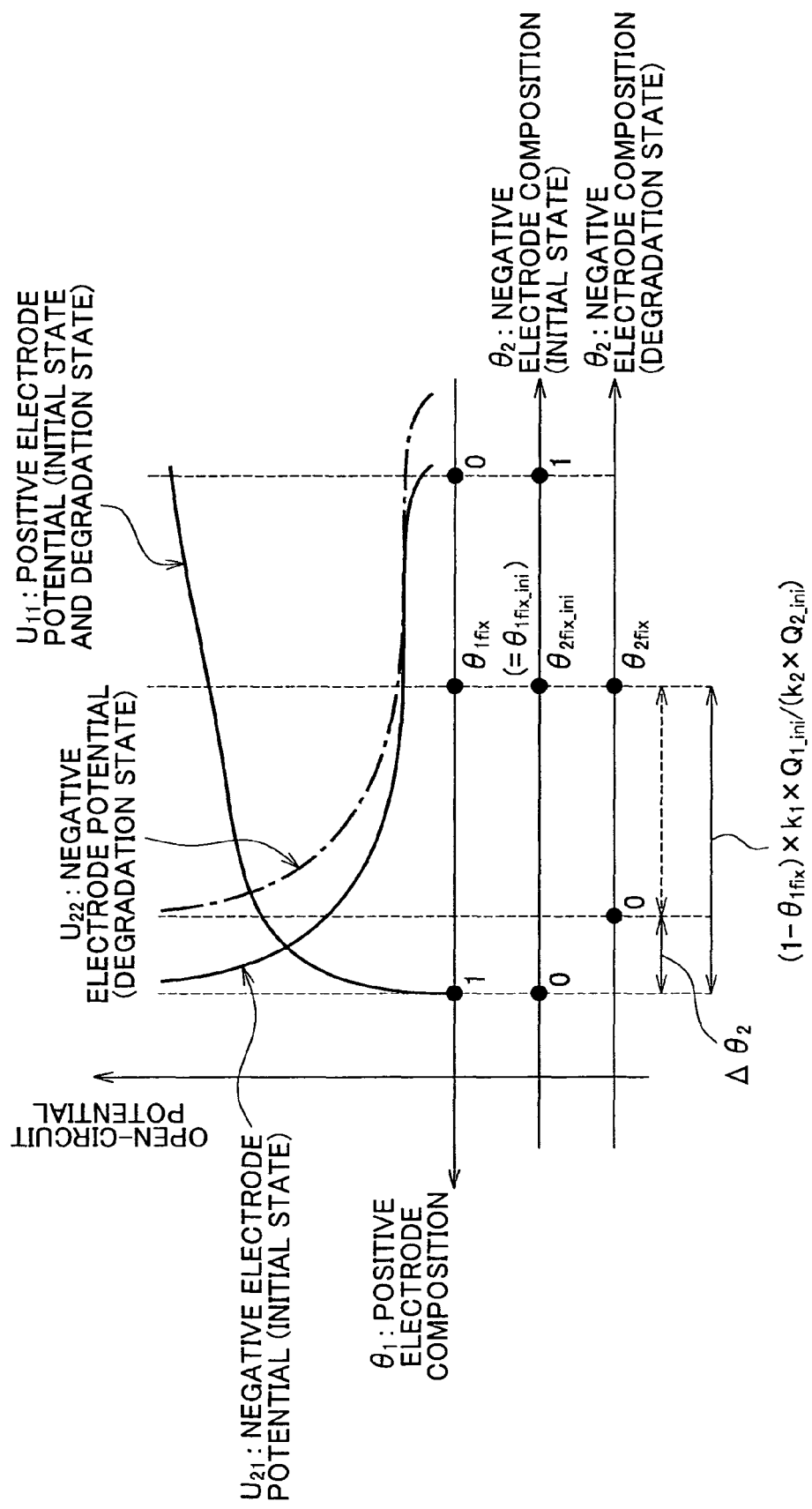
FIG. 4 is a graph that illustrates a shift in composition correspondence due to degradation in the first embodiment of the invention.

FIG. 4 is a schematic graph that illustrates a shift in composition correspondence between the positive electrode and the negative electrode.

When the lithium ion secondary battery is in the degradation state, the capacity in the case where the negative electrode composition $\theta_2$ is 1 is $(Q_{2\_ini}-\Delta Q_2)$. In addition, the capacity shift $\Delta Q_5$ in composition correspondence between the positive electrode and the negative electrode is a capacity corresponding to a shift $\Delta\theta_2$ of the negative electrode composition axis with respect to the positive electrode composition axis. Thus, the relationship expressed by the following mathematical expression (5) holds.

$$1:(\Delta\theta_2=(Q_{2\_ini}-\Delta Q_2):\Delta Q_3 \quad (5)$$

In addition, the following mathematical expression (6) is obtained from the mathematical expression (4) and the mathematical expression (5).

$$\Delta Q_8 = (Q_{2\_ini} - \Delta Q_2) \times \Delta\theta_2 \quad (6)$$

$$= k_2 \times Q_{2\_ini} \times \Delta\theta_2$$

When the lithium ion secondary battery is in the initial state, the positive electrode composition $\theta_{1fix\_ini}$ corresponds to the negative electrode composition $\theta_{2fix\_ini}$. When the lithium ion secondary battery is in the degradation state, the positive electrode composition $\theta_{1fix}$ corresponds to the negative electrode composition $\theta_{2fix}$. In addition, the shift in composition correspondence uses the positive electrode composition $\theta_{1fix}$ in the initial state as a reference. That is, the positive electrode composition $\theta_{1fix}$ is equal to the positive electrode composition $\theta_{1fix\_ini}$.

In the case where a shift in composition correspondence has occurred between the positive electrode and the negative electrode because of degradation of the lithium ion secondary battery, the positive electrode composition $\theta_{1fix}$ and the negative electrode composition $\theta_{2fix}$ after degradation of the lithium ion secondary battery have the relationship expressed by the following mathematical expressions (7) and (8).

$$\theta_{1fix} = \theta_{1fix\_ini} \quad (7)$$

$$\theta_{2fix} = \frac{(1 - \theta_{1fix}) \times k_1 \times Q_{1\_ini} - \Delta Q_8}{k_2 \times Q_{2\_ini}} \quad (8)$$

The meaning of the mathematical expression (8) will be described. The amount of lithium emitted from the positive electrode when the positive electrode composition $\theta_1$ varies (reduces) from 1 to $\theta_{1fix}$ because of degradation of the lithium ion secondary battery is expressed by the following mathematical expression (9).

The amount of lithium emitted from the positive electrode=$(1-\theta_{1fix}) \times k_1 \times Q_{1\_ini}$ (9)

Here, the value of $(1-\theta_{1fix})$ in the mathematical expression (9) indicates a variation in positive electrode composition due to degradation of the lithium ion secondary battery, and the value of $(k_1 \times Q_{1\_ini})$ indicates the positive electrode capacity after degradation of the lithium ion secondary battery.

If it is assumed that all lithium emitted from the positive electrode is introduced into the negative electrode, the negative electrode composition $\theta_{2fix}$ is expressed by the following mathematical expression (10).

$$\theta_{2fix} = \frac{(1 - \theta_{1fix}) \times k_1 \times Q_{1\_ini}}{k_2 \times Q_{2\_ini}} \quad (10)$$

Here, in the mathematical expression (10), the value of $(k_2 \times Q_{2\_ini})$ indicates the negative electrode capacity after degradation of the lithium ion secondary battery.

On the other hand, when there is a shift ($\Delta\theta_2$) in composition correspondence between the positive electrode and the negative electrode, the negative electrode composition $\theta_{2fix}$ is expressed by the following mathematical expression (11).

$$\theta_{2fix} = \frac{(1-\theta_{1fix}) \times k_1 \times Q_{1\_ini}}{k_2 \times Q_{2\_ini}} - \Delta\theta_2 \tag{11}$$

The shift $\Delta\theta_2$ in composition correspondence may be expressed using the capacity shift $\Delta Q_s$ in composition correspondence from the mathematical expression (6). Thus, the negative electrode composition $\theta_{2fix}$ is expressed by the above mathematical expression (8).

As shown in FIG. 4, the open-circuit voltage OCV in the case where the lithium ion secondary battery is in the degradation state is expressed as a potential difference between the positive electrode open-circuit potential $U_{11}$ and the negative electrode open-circuit potential $U_{22}$ in the degradation state. That is, when the three parameters $k_1$, $k_2$, $\Delta Q_s$ are estimated, the negative electrode open-circuit potential $U_{22}$ in the case where the lithium ion secondary battery is in the degradation state may be identified, and the open-circuit voltage OCV may be calculated as a potential difference between the negative electrode open-circuit potential $U_{22}$ and the positive electrode open-circuit potential $U_{11}$.

In the present embodiment, as will be described later, three parameters are used to estimate the internal state of the lithium ion secondary battery. Specifically, this is to estimate whether degradation of the lithium ion secondary battery is due to precipitation of lithium. Degradation of the lithium ion secondary battery includes degradation due to precipitation of lithium and degradation due to wear. If these types of degradation may be identified (estimated) separately, it is possible to determine the degradation state in detail.

Degradation due to wear is degradation of the lithium ion secondary battery other than degradation due to precipitation of lithium, and means that the performance (ability to accept lithium) of the positive electrode and the negative electrode decreases because of energization, standing, or the like. Degradation due to wear is, for example, wear of the active material of the positive electrode or negative electrode. In addition, degradation due to precipitation of lithium means degradation such that lithium ions used for a battery reaction change to a by-product (mostly, metal lithium) and, therefore, lithium ions do not contribute to the battery reaction.

The open-circuit voltage OCV in the case where the lithium ion secondary battery is not degraded coincides with the open-circuit voltage OCV in the case where the lithium ion secondary battery is in the initial state. That is, when the positive electrode capacity retention rate $k_1$ and the negative electrode capacity retention rate $k_2$ are 1 and the capacity shift $\Delta Q_s$ in composition correspondence is 0, the open-circuit voltage OCV calculated (estimated) in the above description coincides with a value (measured value) in the case where the open-circuit voltage OCV of the lithium ion secondary battery in the initial state (new).

Figure 5:
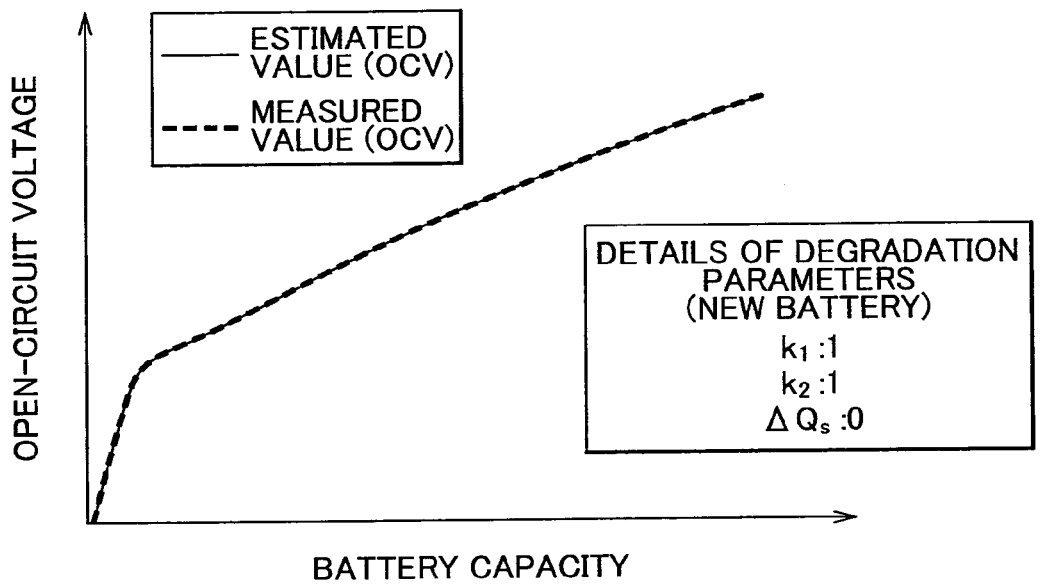
FIG. 5 is a graph that illustrates a degradation parameter when an open-circuit voltage curve (estimated value) is brought to coincide with an open-circuit voltage curve (measured value) in the case where a new lithium ion secondary battery is used in the first embodiment of the invention.

FIG. 5 shows the relationship between the capacity (SOC) of the new lithium ion secondary battery and the open-circuit voltage OCV (which corresponds to the open-circuit voltage characteristic, and, hereinafter, referred to as open-circuit voltage curve). In FIG. 5, the dotted line is an open-circuit voltage curve (measured value), and the solid line is an open-circuit voltage curve (estimated value). The open-circuit voltage curve (estimated value) overlaps with the open-circuit voltage curve (measured value). In FIG. 5, the ordinate axis represents the open-circuit voltage OCV, and the abscissa axis represents the capacity of the lithium ion secondary battery. Note that the open-circuit voltage curve (measured value) may deviate from the open-circuit voltage curve (estimated value) by the amount of measurement error.

On the other hand, as the lithium ion secondary battery degrades, the open-circuit voltage (measured value) OCV varies. Here, the dotted line in FIG. 6 (graph corresponding to FIG. 5) indicates the measured results of the open-circuit voltage curve (measured value) using the lithium ion secondary battery in which only degradation due to precipitation of lithium has occurred, that is, the lithium ion secondary battery in which no degradation due to wear has occurred.

Here, when the lithium ion secondary battery is maintained in a low-temperature state, wear degradation may be suppressed, and only precipitation of lithium may be caused to occur in a state where wear degradation is suppressed. By carrying out an experiment as to whether wear degradation occurs under a plurality of temperature conditions, a preset temperature for placing the lithium ion secondary battery in a low-temperature state may be determined. By so doing, only degradation due to precipitation of lithium may be caused to occur in the lithium ion secondary battery.

Figure 6:
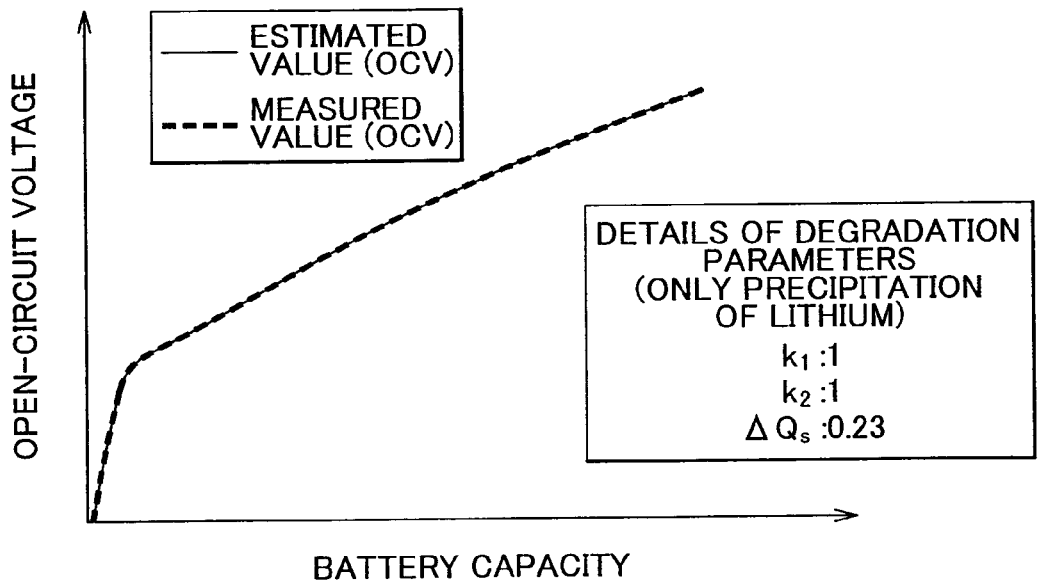
FIG. 6 is a graph that illustrates degradation parameters when an open-circuit voltage curve (estimated value) is brought to coincide with an open-circuit voltage curve (measured value) in the case where only degradation due to precipitation of lithium is caused to occur in the first embodiment of the invention.

When the three degradation parameters ($k_1$, $k_2$, $\Delta Q_s$) are estimated, the open-circuit voltage curve (estimated value) may be caused to substantially coincide with the open-circuit voltage curve (measured value) shown in FIG. 6. In other words, the three degradation parameters may be found so that the open-circuit voltage curve (estimated value) substantially coincides with the open-circuit voltage curve (measured value).

FIG. 6 shows a state where the open-circuit voltage (measured value) OCV substantially coincides with the open-circuit voltage (estimated value) OCV. As the degradation parameters for determining the open-circuit voltage curve (estimated value) at this time, the positive electrode capacity retention rate $k_1$ is "1", the negative electrode capacity retention rate $k_2$ is "1" and the capacity shift $\Delta Q_s$ in composition correspondence is "0.23".

Figure 7:
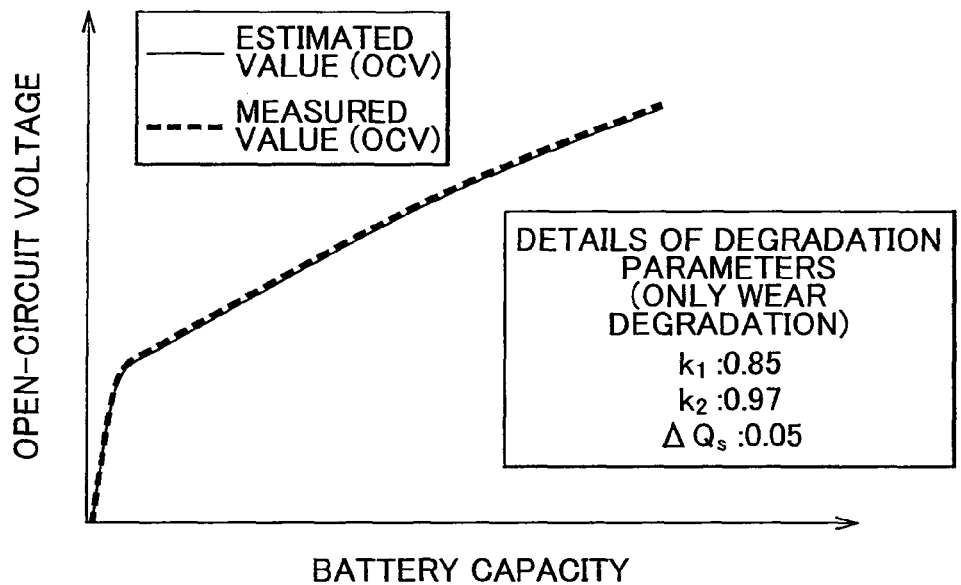
FIG. 7 is a graph that illustrates degradation parameters when an open-circuit voltage curve (estimated value) is brought to coincide with an open-circuit voltage curve (measured value) in the case where only wear degradation is caused to occur in the first embodiment of the invention.

The dotted line in FIG. 7 indicates the measured results of the open-circuit voltage curve (measured value) using the lithium ion secondary battery in which only degradation due to wear has occurred, that is, the lithium ion secondary battery in which no lithium is precipitated. In FIG. 7, the ordinate axis represents the open-circuit voltage OCV, and the abscissa axis represents the capacity of the lithium ion secondary battery.

Here, when the lithium ion secondary battery is maintained in a high-temperature state, precipitation of lithium may be suppressed, and only degradation due to wear may be caused to occur in a state where precipitation of lithium is suppressed. By carrying out an experiment as to whether lithium precipitates under a plurality of temperature conditions, a preset temperature for placing the lithium ion secondary battery in a high-temperature state may be determined. The preset temperature may be, for example, 50° C. By so doing, only degradation due to wear may be caused to occur in the lithium ion secondary battery.

When the three degradation parameters ($k_1$, $k_2$, $\Delta Q_s$) are estimated, the open-circuit voltage curve (estimated value) may be caused to substantially coincide with the open-circuit voltage curve (measured value) shown in FIG. 7. In other words, the three degradation parameters may be found so that the open-circuit voltage curve (estimated value) substantially coincides with the open-circuit voltage curve (measured value).

FIG. 7 shows a state where the open-circuit voltage (measured value) OCV substantially coincides with the open-circuit voltage (estimated value) OCV. As the degradation parameters for determining the open-circuit voltage curve (estimated value) at this time, the positive electrode capacity retention rate $k_1$ is "0.85", the negative electrode capacity retention rate $k_2$ is "0.97" and the capacity shift $\Delta Q_s$ in composition correspondence is "0.05".

As shown in FIG. 6, in the lithium ion secondary battery in which only degradation due to precipitation of lithium has occurred, it appears that only the capacity shift $\Delta Q_s$ in composition correspondence among the three degradation parameters ($k_1$, $k_2$, $\Delta Q_s$) has changed from the capacity shift $\Delta Q_s$ (=0) in composition correspondence in the new (initial state) lithium ion secondary battery.

In addition, as shown in FIG. 7, in the lithium ion secondary battery in which only degradation due to wear has occurred, it appears that all the three degradation parameters ($k_1$, $k_2$, $\Delta Q_s$) deviate from those of the new (initial state) lithium ion secondary battery.

Precipitation of lithium presumably indicates that, fox example, lithium ions emitted from the positive electrode during charging may not be introduced into the negative electrode. In this case, the composition correspondence between the positive electrode and the negative electrode deviates, and the capacity shift $\Delta Q_s$ varies. In addition, in a state where only precipitation of lithium has occurred, the abilities of the positive electrode and negative electrode to accept lithium do not decrease, so the capacity retention rates $k_1$ and $k_2$ are maintained at "1".

Thus, when only the capacity shift $\Delta Q_s$ in composition correspondence differs from "0", it may be determined that, inside the lithium ion secondary battery, only degradation due to precipitation of lithium has occurred and degradation due to wear has not occurred. In addition, the capacity shift $\Delta Q_s$ varies with the amount of precipitation of lithium, so, the correspondence relationship between the capacity shift $\Delta Q_s$ and the amount of precipitation of lithium is obtained through an experiment in advance, it is possible to estimate the amount of precipitation of lithium on the basis of the capacity shift $\Delta Q_s$.

Next, a system for estimating the degradation state of the lithium ion secondary battery (which corresponds to a degradation determination device) will be described with reference to FIG. 8.

A load 30 is connected to a lithium ion secondary battery 10 via switches 21 and 22, and the load 30 is supplied with electric power from the lithium ion secondary battery 10. In addition, a power supply 40 is connected to the lithium ion secondary battery 10 via the switches 21 and 22, and the lithium ion secondary battery 10 is supplied with electric power from the power supply 40. By switching the switches 21 and 22, it is possible to switch between discharge and charge of the lithium ion secondary battery 10.

Figure 8:
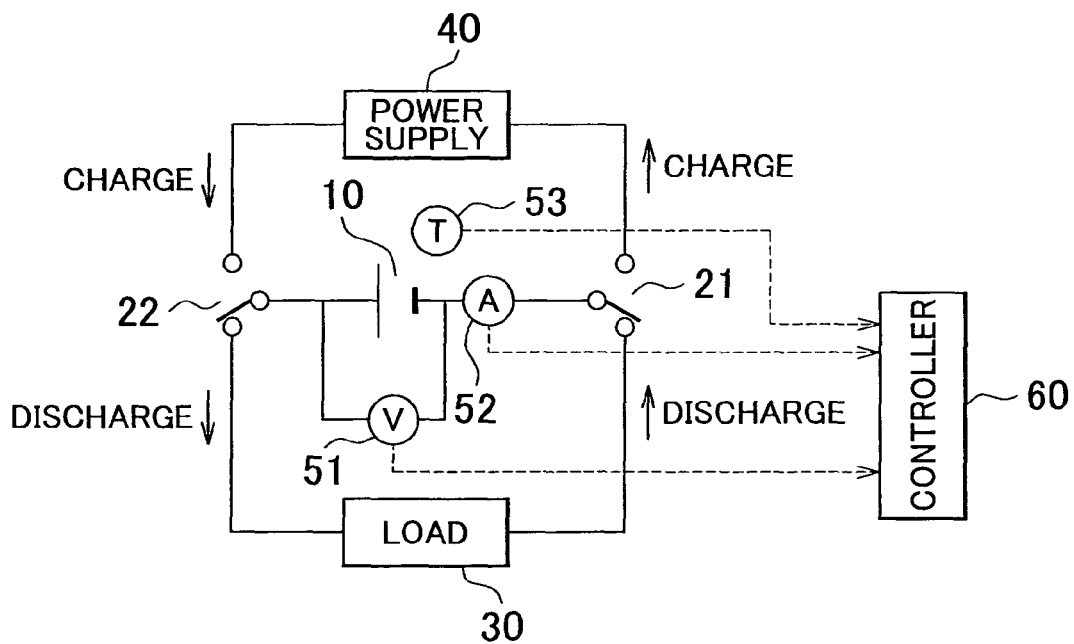
FIG. 8 is a schematic view that shows a system for estimating the internal state of a lithium ion secondary battery in the first embodiment of the invention.

In FIG. 8, the lithium ion secondary battery 10 is connected to the load 30 or the power supply 40 as the switches 21 and 22 are switched; however, the configuration is not limited to this. That is, it is applicable as long as the lithium ion secondary battery 10 may be connected to the load 30 or may be connected to the power supply 40.

In FIG. 8, one lithium ion secondary battery 10 is shown; instead, a battery pack formed of a plurality of the lithium ion secondary batteries 10 may be used. In the battery pack, the plurality of lithium ion secondary batteries 10 are electrically connected in series with one another. Here, inside the battery pack, the lithium ion secondary battery 10 that is electrically connected in parallel with the other lithium ion secondary batteries 10 may be included.

When the battery pack is used, the battery pack may be equipped for a vehicle. The vehicle may be a hybrid vehicle or an electric vehicle. The hybrid vehicle includes a fuel cell or an internal combustion engine in addition to a battery pack as a power source for propelling the vehicle. The electric vehicle uses only a battery pack as a power source for propelling the vehicle.

In the vehicle equipped with the battery pack, an inverter may be used as the load 20. The inverter converts direct-current power from the battery pack to alternating-current power, and supplies the alternating-current power to a motor generator. The motor generator generates kinetic energy for propelling the vehicle. Here, it is applicable that a step-up circuit may be arranged between the battery pack and the inverter, the output voltage of the battery pack is stepped up and then the stepped-up voltage is supplied to the inverter. When the battery pack is equipped for the vehicle, the battery pack is detached from the vehicle, and then the open-circuit voltage of the lithium ion secondary batteries 10 may be measured using the system shown in FIG. 8.

A voltage sensor (which corresponds to a measuring unit) 51 detects the voltage of the lithium ion secondary battery 10, and then outputs the detected voltage to a controller (which corresponds to a determining unit) 60. A current sensor 52 detects the current passing through the lithium ion secondary battery 10 and then outputs the detected current to the controller 60. A temperature sensor 53 detects the temperature of the lithium ion secondary battery 10 and then outputs the detected temperature to the controller 60.

When the lithium ion secondary battery 10 is connected to the power supply 40, the open-circuit voltage OCV of the lithium ion secondary battery 10 may be measured while varying the capacity (charging rate) of the lithium ion secondary battery 10. By so doing, as shown in FIG. 5 to FIG. 7, it is possible to acquire data (open-circuit voltage curve) that indicates a variation in open-circuit voltage (measured value) OCV with respect to a variation in capacity of the lithium ion secondary battery 10.

When the open-circuit voltage (measured value) OCV may be acquired, it is possible to find degradation parameters so that the open-circuit voltage (estimated value) OCV coincides with the open-circuit voltage (measured value) OCV. Then, it is possible to determine the degradation state of the lithium ion secondary battery on the basis of the details of the degradation parameters.

According to the present embodiment, even without analyzing the amount of precipitation of lithium by disassembling the lithium ion secondary battery, it is possible to estimate precipitation of lithium by estimating the three degradation parameters ($k_1$, $k_2$, $\Delta Q_s$). When precipitation of lithium may be estimated, it is possible to control charge and discharge of the lithium ion secondary battery on the basis of the estimated result.

For example, it is possible to limit charging current for charging the lithium ion secondary battery with an increase in the amount of precipitation of lithium. In addition, charging the lithium ion secondary battery may be stopped depending on the amount of precipitation of lithium. By so doing, it is possible to suppress further precipitation of lithium.

In addition, in the present embodiment, because the amount of precipitation of lithium at the time when the open-circuit voltage (measured value) OCV is measured may be estimated, it is possible to carry out charge and discharge control in response to a current state of the lithium ion secondary battery. Thus, it is possible to prevent excessive limitation on charge and discharge of the lithium ion secondary battery, and the performance (input/output characteristic) of the lithium ion secondary battery may be fully exercised while ensuring the safety of the lithium ion secondary battery.

A phenomenon of lithium precipitation tends to occur when the lithium ion secondary battery is in a low-temperature state, so, particularly in the low-temperature state, charge and discharge control may be carried out after the amount of precipitation of lithium is estimated as described in the present embodiment.

A second embodiment of the invention will be described. In the present embodiment, degradation due to precipitation of lithium is estimated in consideration of degradation due to wear. Actual degradation in the lithium ion secondary battery mixedly includes degradation due to precipitation of lithium and degradation due to wear. That is, the capacity shift $\Delta Q_s$ described in the first embodiment includes a capacity shift $\Delta Q_s$ caused by degradation due to precipitation of lithium and a capacity shift $\Delta Q_s$ caused by degradation due to wear.

Then, in order to estimate a precipitation state of lithium, it is desirable to distinguish the capacity shift $\Delta Q_s$ caused by degradation due to precipitation of lithium from the capacity shift $\Delta Q_s$ caused by degradation due to wear. The present embodiment is to identify degradation due to precipitation of lithium when degradation due to precipitation of lithium and degradation due to wear are mixedly included in the degradation of the lithium ion secondary battery. Hereinafter, the characteristic portion of the present embodiment will be described.

First, a map used to identify a degradation component due to wear will be described. The map indicates the correspondence relationship among the capacity retention rates $k_1$ and $k_2$ and the capacity shift $\Delta Q_s$ in composition correspondence in the case where only wear degradation is caused to occur in the lithium ion secondary battery. The map is prepared in advance. As described above, when the lithium ion secondary battery is maintained in a high-temperature state, precipitation of lithium may be prevented, and only wear degradation may be caused to occur.

By causing degradation due to wear to advance in a stepwise manner, the capacity (full charge capacity) of the lithium ion secondary battery is reduced by a predetermined amount in a stepwise manner. Then, each time the capacity of the lithium ion secondary battery is reduced, the open-circuit voltage OCV of the lithium ion secondary battery is measured. By so doing, when the lithium ion secondary battery is subjected to predetermined capacity degradation, it is possible to obtain data (open-circuit voltage curve (measured value)) that indicates a variation in open-circuit voltage OCV with respect to a variation in capacity. For example, until the capacity of the lithium ion secondary battery changes from 100% to 50%, the capacity is decreased (degraded) 5% by 5%, and the open-circuit voltage OCV of the lithium ion secondary battery is measured each time the capacity is decreased.

Figure 9:
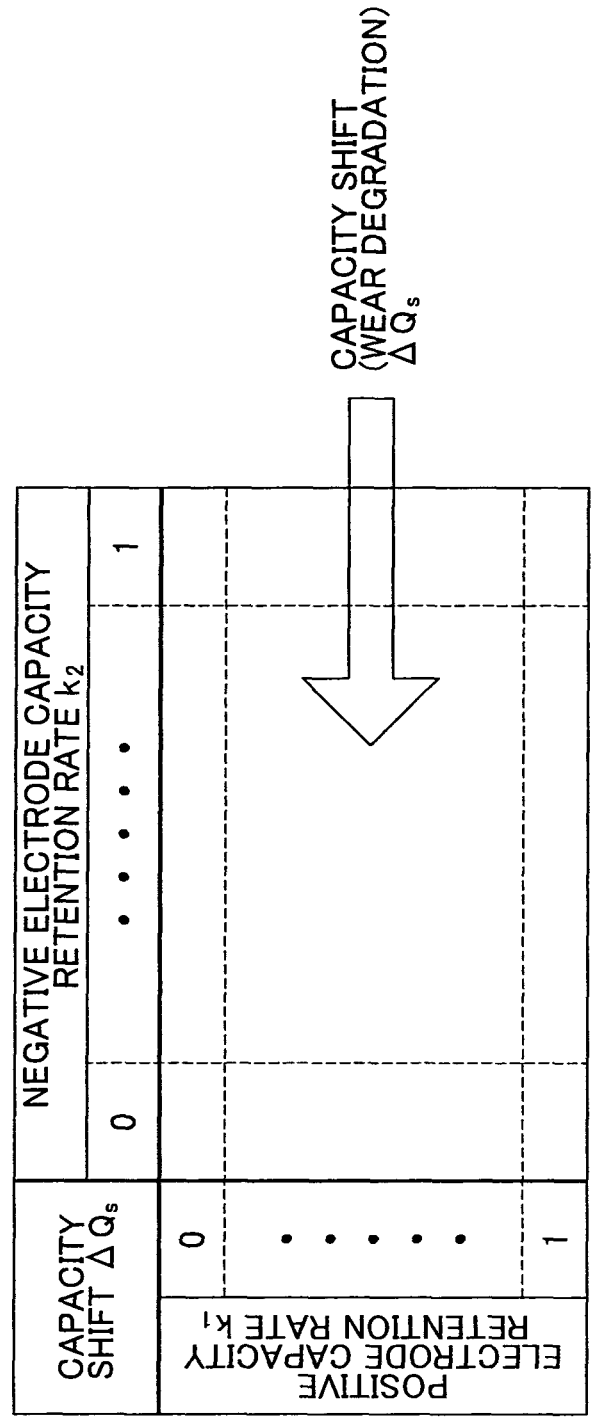
FIG. 9 is a table that shows the relationship among a positive electrode capacity retention rate, a negative electrode capacity retention rate and a capacity shift in composition correspondence in the case where only wear degradation is caused to occur in a second embodiment of the invention.

Then, it is possible to find the degradation parameters (the capacity retention rates $k_1$ and $k_2$ and the capacity shift $\Delta Q_s$) for bringing the open-circuit voltage (estimated value) OCV to coincide with the open-circuit voltage (measured value) OCV obtained in each capacity degradation. Thus, it is possible to obtain the map (hereinafter, referred to as wear degradation map) shown in FIG. 9. The wear degradation map shown in FIG. 9 indicates the correspondence relationship among the capacity retention rates $k_1$ and $k_2$ and the capacity shift $\Delta Q_s$, so the capacity shift $\Delta Q_s$ may be, for example, identified when the capacity retention rates $k_1$ and $k_2$ are selected. The wear degradation map may be stored in the memory.

Figure 10:
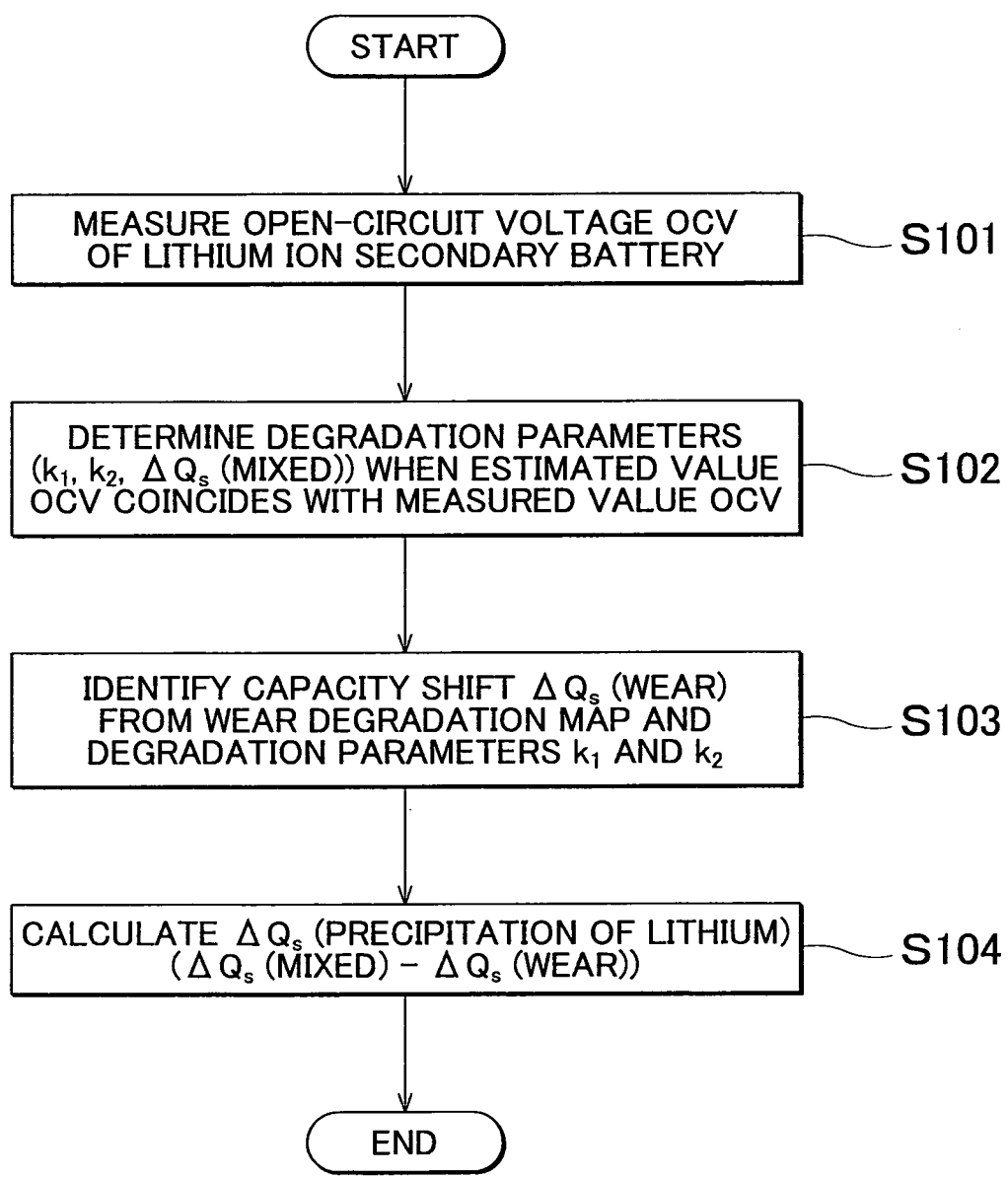
FIG. 10 is a flowchart that shows the process of estimating the amount of precipitation of lithium in the second embodiment of the invention.

Next, the process of estimating a precipitation state of lithium in the present embodiment will be described with reference to the flowchart shown in FIG. 10. The process shown in FIG. 10 may be executed by the controller 60 described in the first embodiment.

In step S101, the controller 60 measures the open-circuit voltage (measured value) OCV of the lithium ion secondary battery on the basis of the output of the voltage sensor 51. Specifically, the open-circuit voltage (measured value) OCV is measured while charging the lithium ion secondary battery to thereby make it possible to obtain the open-circuit voltage curve (measured value). The lithium ion secondary battery used to measure the open-circuit voltage (measured value) OCV is an object of which the degradation state is estimated. It is assumed that degradation due to precipitation of lithium and wear degradation have mixedly occurred in the lithium ion secondary battery.

In step S102, the controller 60 determines whether the open-circuit voltage (estimated value) OCV identified by the three degradation parameters coincides with the open-circuit voltage (measured value) OCV obtained in step S101 while appropriately varying the three degradation parameters (the capacity retention rates $k_1$ and $k_2$ and the capacity shift $\Delta Q_s$).

Figure 11:
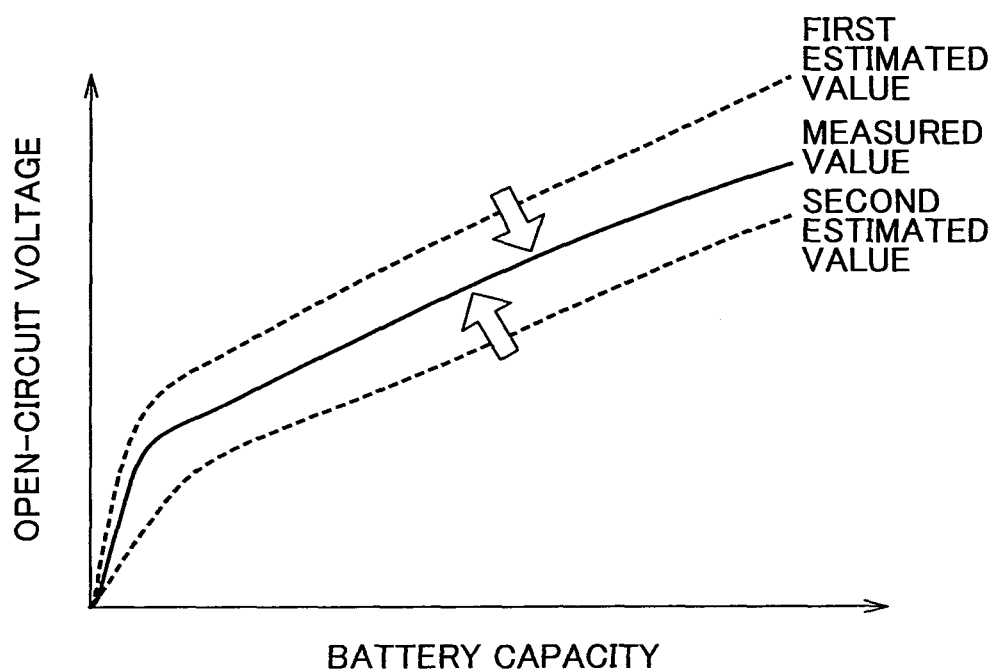
FIG. 11 is a schematic graph for illustrating the process of bringing an open-circuit voltage curve (estimated value) to coincide with an open-circuit voltage curve (measured value) in the second embodiment of the invention.

Specifically, a selected combination of the three degradation parameters is set, and the open-circuit voltage (estimated value) OCV is calculated on the basis of the set degradation parameters. FIG. 11 shows the relationship between the open-circuit voltage (estimated value) OCV and the open-circuit voltage (measured value) OCV. In FIG. 11, the dotted line indicates the open-circuit voltage (estimated value) OCV, and the solid line indicates the open-circuit voltage (measured value) OCV.

In FIG. 11, when the open-circuit voltage curve of a first estimated value is obtained, the open-circuit voltage (estimated value) OCV is higher than the open-circuit voltage (measured value) OCV, so the degradation parameters are reset so that the open-circuit voltage curve of the first estimated value approaches the open-circuit voltage curve of the measured value. Similarly, when the open-circuit voltage curve of a second estimated value is obtained, the open-circuit voltage (estimated value) OCV is lower than the open-circuit voltage (measured value) OCV, so the degradation parameters are reset so that the open-circuit voltage curve of the second estimated value approaches the open-circuit voltage curve of the measured value. In this way, by repeatedly setting the degradation parameters, it is possible to bring the open-circuit voltage (estimated value) OCV to coincide with the open-circuit voltage (measured value) OCV In addition, in step S102, the degradation parameters by which the open-circuit voltage (estimated value) OCV coincides with the open-circuit voltage (measured value) OCV are identified. The capacity shift $\Delta Q_s$ identified in step S102 is the capacity shift $\Delta Q_s$ (mixed) when degradation due to precipitation of lithium and wear degradation are mixed.

Here, even when the open-circuit voltage (estimated value) OCV does not completely coincide with the open-circuit voltage (measured value) OCV, by setting a range that may be regarded as coincidence (allowable error), it is possible to determined whether the open-circuit voltage (estimated value) OCV coincides with the open-circuit voltage (measured value) OCV.

In step S103, the controller 60 uses the capacity retention rates $k_1$ and $k_2$ determined in step S102 and the wear degradation map (FIG. 9) to identify the capacity shift $\Delta Q_s$. The capacity shift $\Delta Q_s$ identified here is the capacity shift $\Delta Q_s$ (wear) due to only wear degradation, and corresponds to a first variation amount according to the aspect of the invention.

As described in the first embodiment, the capacity retention rates $k_1$ and $k_2$ do not vary because of only degradation due to precipitation of lithium but vary when wear degradation has occurred. Thus, when the capacity retention rates $k_1$ and $k_2$ obtained in step S102 are smaller than 1, it appears that the capacity retention rates $k_1$ and $k_2$ depend on wear degradation. In addition, the wear degradation map indicates the correspondence relationship among the capacity retention rates $k_1$ and $k_2$ and the capacity shift $\Delta Q_s$ when only wear degradation has occurred, so the capacity shift $\Delta Q_s$ (wear) may be identified when the capacity retention rates $k_1$ and $k_2$ are acquired.

In step S104, the controller 60 obtains a difference between the capacity shift $\Delta Q_s$ (mixed) obtained in step S102 and the capacity shift $\Delta Q_s$ (wear) obtained in step S103. The difference is the capacity shift $\Delta Q_s$ (precipitation of lithium) caused by degradation due to precipitation of lithium, and corresponds to a second variation amount according to the aspect of the invention. The amount of precipitation of lithium may be identified when the capacity shift $\Delta Q_s$ (precipitation of lithium) is acquired as described in the first embodiment.

Note that, by identifying the capacity shift $\Delta Q_s$ (wear) and the capacity shift $\Delta Q_s$ (precipitation of lithium), it is possible to calculate a decrease in full charge capacity due to wear degradation or a decrease in full charge capacity due to degradation of precipitation of lithium. That is a component due to wear degradation and a component due to precipitation of lithium in the capacity shift $\Delta Q_s$ may be identified, so it is possible to obtain a decrease in full charge capacity due to each degradation from these components.

According to the present embodiment, when degradation due to precipitation of lithium and degradation due to wear are mixedly included, it is possible to acquire (estimate) a degradation component due to precipitation of lithium and a degradation component due to wear separately. Then, when a degradation component due to precipitation of lithium may be identified, it is possible to quantify the amount of precipitation of lithium.

Next, a third embodiment of the invention will be described. In the present embodiment, the process described in the second embodiment (FIG. 10) is executed by an on-board device. Specifically, in a state where the lithium ion secondary battery is equipped for the vehicle, a controller (ECU) that controls charge and discharge of the lithium ion secondary battery is used to execute the process described in the second embodiment (FIG. 10). In the present embodiment, a vehicle that may be charged externally is used as the vehicle equipped with the lithium ion secondary battery. The vehicle is a plug-in hybrid vehicle (PRY) or an electric vehicle (EV).

Figure 12:
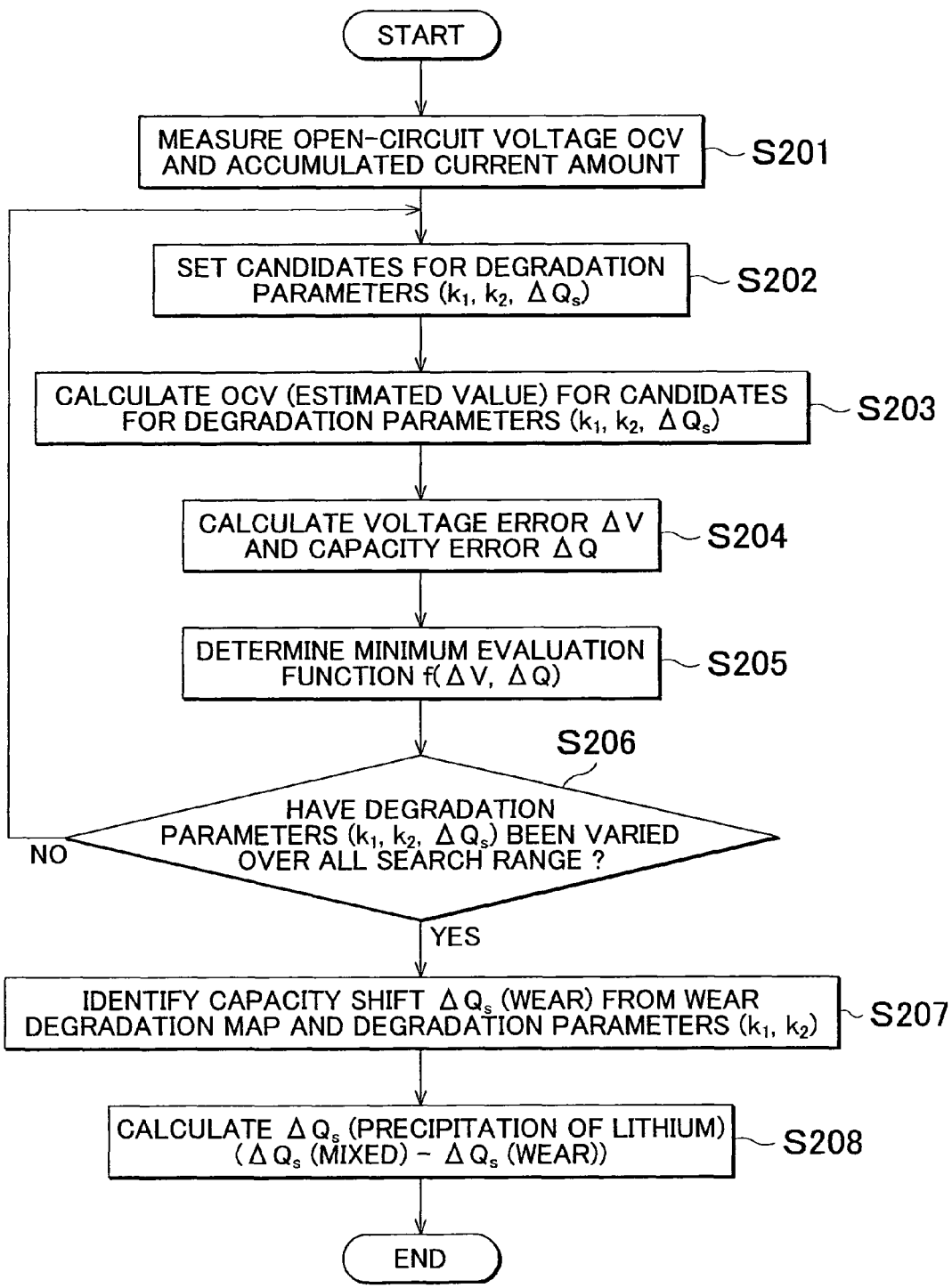
FIG. 12 is a flowchart that shows the process of estimating the amount of precipitation of lithium in a third embodiment of the invention.

The process in the present embodiment will be described with reference to FIG. 12. The process shown in FIG. 12 is executed by the controller (which corresponds to the controller 60 shown in FIG. 8) equipped for the vehicle.

In step S201, the controller 60 measures the open-circuit voltage (measured value) OCV of the lithium ion secondary battery on the basis of the output of the voltage sensor 51, and measures the accumulated current amount on the basis of the output of the current sensor 52. Specifically, when the lithium ion secondary battery equipped for the vehicle is charged, the open-circuit voltage (measured value) OCV and the accumulated current amount are measured to thereby make it possible to acquire the curve that indicates the open-circuit voltage (measured value) OCV (open-circuit voltage curve as the measured value) with respect to the battery capacity.

In step S202, the controller 60 sets (selects) candidates for the degradation parameters (the capacity retention rates $k_1$ and $k_2$ and the capacity shift $\Delta Q_s$) for identifying the open-circuit voltage (estimated value) OCV. The degradation parameters may be set by various methods; however, it is desirable to employ a method for efficiently executing processing for setting the degradation parameters.

For example, a range in which wear degradation or degradation due to precipitation of lithium actually occurs may be specified in advance as a selected range of the degradation parameters on the basis of an experiment, or the like. Here, the capacity retention rates $k_1$ and $k_2$ depend only on wear degradation, so the capacity retention rates $k_1$ and $k_2$ may be varied within the range in which actual wear degradation occurs. Then, when the capacity retention rates $k_1$ and $k_2$ are identified, it is possible to identify the capacity shift $\Delta Q_s$ (wear) due to wear degradation using the wear degradation map (FIG. 9) described in the second embodiment. When the capacity shift $\Delta Q_s$ (wear) may be identified, it is only necessary to vary the capacity shift $\Delta Q_s$ (precipitation of lithium).

Then, in step S203, the characteristic that indicates a variation in open-circuit voltage (estimated value) OCV with respect to a variation hi capacity (the open-circuit voltage curve as the estimated value) on the basis of the degradation parameters set in step S202.

In step S204, the controller 60 calculates an error between the open-circuit voltage curve (estimated value) calculated in step S203 and the open-circuit voltage curve (measured value) obtained in step S201. The error includes a voltage error and a capacity error.

Figure 13:
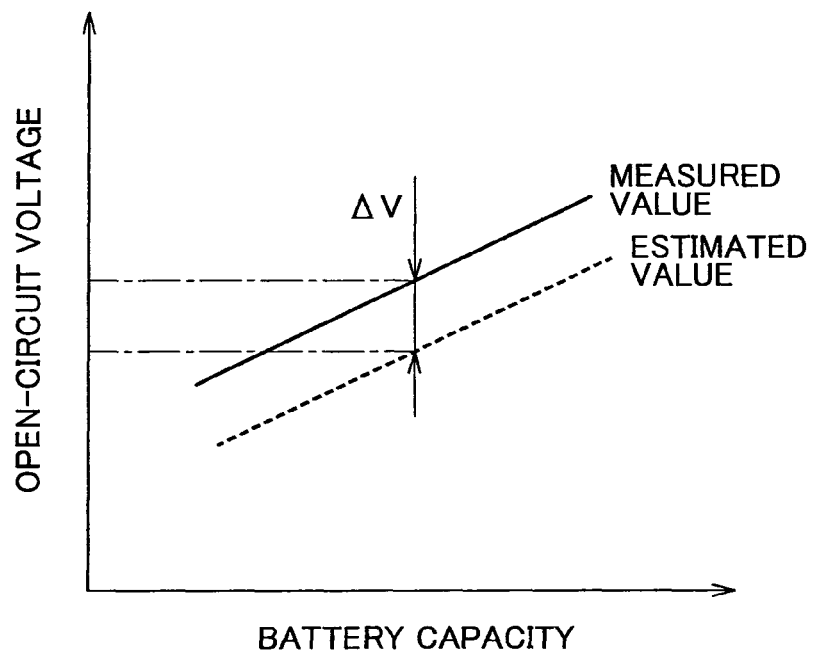
FIG. 13 is a graph that shows an error voltage between an open-circuit voltage curve (estimated value) and an open-circuit voltage curve (measured value) in the third embodiment of the invention.

A voltage error $\Delta V$ (see FIG. 13) may be specifically calculated by comparing the open-circuit voltage curve (estimated value) with the open-circuit voltage curve (measured value). The voltage error $\Delta V$ may be a voltage error at a specific battery capacity or may be an average of voltage errors between two open-circuit voltage curves.

In addition, the capacity error $\Delta Q$ may be obtained by, for example, a method described below. First, the open-circuit voltage curve (estimated value) is used to calculate the capacity $Q_1$ between the open-circuit voltage before charging and the open-circuit voltage after charging. In addition, from the start of charging to the end of charging, a current is detected to measure an accumulated current amount to thereby make it possible to calculate the charging capacity $Q_2$ from the accumulated current amount. By obtaining a difference between the above described capacity $Q_1$ and capacity $Q_2$, it is possible to obtain the absolute value of the capacity error $\Delta Q$ ($|Q_1 - Q_2|$).

Here, in a hybrid vehicle that is not equipped with a charger, it is difficult to obtain the open-circuit voltage curve (measured value). However, when the lithium ion secondary battery is in a relaxation state, some open-circuit voltages located on the open-circuit voltage curve (measured value) may be measured. Here, when a current is flowing through the lithium ion secondary battery or immediately after the current is interrupted, a difference in lithium concentration exists in the active materials, so an accurate open-circuit voltage cannot be measured.

On the other hand, when a period of time has elapsed from interruption of current passing through the lithium ion secondary battery, the lithium ion secondary battery becomes a relaxation state, and an accurate open-circuit voltage may be measured in a state where no difference in lithium concentration exists. The case where the lithium ion secondary battery is in a relaxation state is, for example, when the vehicle is stopped. Thus, it is possible to obtain the open-circuit voltage (measured value) OCV when the lithium ion secondary battery has a specific capacity.

Figure 14:
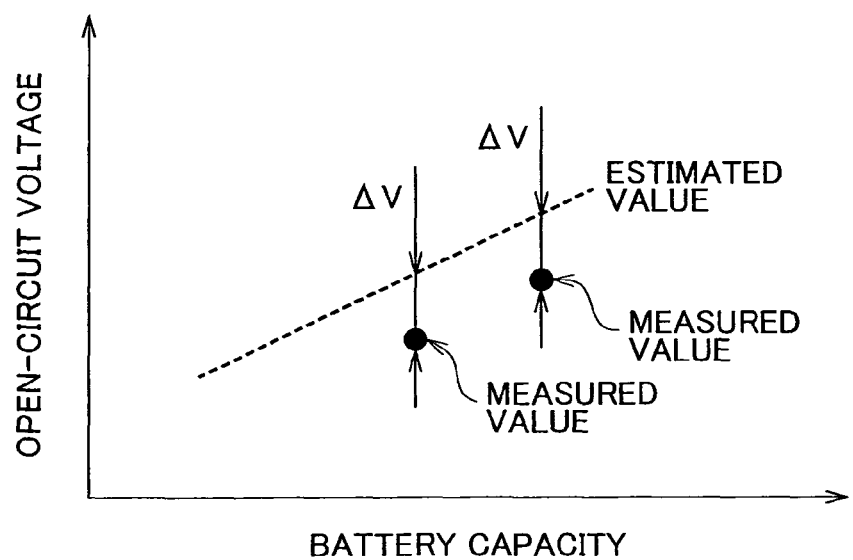
FIG. 14 is a graph that shows an error voltage between an open-circuit voltage curve (estimated value) and an open-circuit voltage in the third embodiment of the invention.

When a specific open-circuit voltage at the specific capacity may be measured, as shown in FIG. 14, the voltage error ΔV may be obtained by comparing the open-circuit voltage (measured value) with the open-circuit voltage curve (estimated value). In addition, when a plurality of open-circuit voltages (measured values) are measured in advance, the capacity error ΔQ may be obtained as described above. Specifically, the open-circuit voltage curve (estimated value) is used to calculate the capacity $Q_1$ between two open-circuit voltages (measured values). In addition, when an accumulated current value is measured at the time when the two open-circuit voltages (measured values) are obtained, the capacity $Q_2$ may be calculated from the accumulated current value. Then, when the difference between the capacity $Q_1$ and the capacity $Q_2$ ($|Q_1-Q_2|$) is obtained, the absolute value of the capacity error ΔQ may be obtained.

In step S205, the controller 60 calculates an evaluation function f(ΔV, ΔQ) for the voltage error ΔV and capacity error ΔQ obtained in step S204. The evaluation function f(ΔV, ΔQ) may, for example, be a value that is obtained by adding the voltage error ΔV and the capacity error ΔQ with weights.

In addition, the controller 60 determines whether the evaluation function f(ΔV, ΔQ) calculated from the currently set degradation parameters is smaller than the evaluation function f(ΔV, ΔQ) calculated from the previously set degradation parameters. Here, when the current evaluation function f(ΔV, ΔQ) is smaller than the previous evaluation function f(ΔV, ΔQ), the current evaluation function f(ΔV, ΔQ) is stored in the memory. Note that, when the current evaluation function f(ΔV, ΔQ) is larger than the previous evaluation function f(ΔV, ΔQ), the previous evaluation function f(ΔV, ΔQ) remains stored in the memory.

In step S206, the controller 60 determines whether the degradation parameters have been varied over all the search range. When the degradation parameters have been varied over all the search range, the process proceeds to step S207. On the other hand, when the degradation parameters have not been varied over all the search range, the process returns to step S202.

Until the degradation parameters have been varied over all the search range in this way, the process repeats step S202 to step S206. Then, the minimum evaluation function f(ΔV, ΔQ) is identified, the open-circuit voltage curve by which the evaluation function (minimum) is obtained may be identified, and the degradation parameters ($k_1$, $k_2$, $\Delta Q_s$) that define the open-circuit voltage curve (estimated value) may be identified. By identifying the degradation parameters of which the evaluation function is minimum, it is possible to improve the accuracy of determination as to the degradation state (wear degradation and degradation due to precipitation of lithium).

Here, the identified capacity shift $\Delta Q_s$ (mixed) includes the capacity shift $\Delta Q_s$ (wear) caused by wear degradation and the capacity shift $\Delta Q_s$ (precipitation of lithium) caused by degradation due to precipitation of lithium.

In step S207, the controller 60 uses the degradation parameters (capacity retention rates $k_1$ and $k_2$) determined in step S202 to step S206 and the wear degradation map (FIG. 9) described in the second embodiment to identify the capacity shift $\Delta Q_s$ (wear) caused by wear degradation. Then, in step S208, the controller 60 calculates a difference between the capacity shift $\Delta Q_s$ (mixed) identified in step S202 to step S206 and the capacity shift $\Delta Q_s$ (wear) identified in step S207 to thereby identify the capacity shift $\Delta Q_s$ (precipitation of lithium). When the capacity shift $\Delta Q_s$ (precipitation of lithium) may be identified, it is possible to estimate the amount of precipitation of lithium as described in the first embodiment.

Next, a fourth embodiment of the invention will be described. In the present embodiment, the details for determining the degradation parameters ($k_1$, $k_2$, $\Delta Q_s$) are different from the process described in the third embodiment (FIG. 12). Hereinafter, the difference from the third embodiment will be mainly described.

Lithium precipitated through charging contains a reversible component that can contribute to a battery reaction again and an irreversible component that does not contribute to a battery reaction. The irreversible component may be identified on the basis of the capacity shift $\Delta Q_s$ (precipitation of lithium) as described in the third embodiment.

On the other hand, the reversible component may be caused to contribute to a battery reaction again by leaving the lithium ion secondary battery standing or discharging the lithium ion secondary battery at a predetermined rate. When precipitated lithium (reversible component) returns to a state that contributes to a battery reaction, it is difficult to acquire the stable open-circuit voltage (measured value) OCV, so the voltage error ΔV exceeds an allowable range even when the open-circuit voltage (estimated value) OCV is estimated. That is, when precipitated lithium is returned to a state that contributes to a battery reaction, the amount of precipitation of lithium cannot be accurately estimated.

Then, in the present embodiment, it is determined whether lithium is returned to a state that contributes to a battery reaction. Specifically, it is only necessary that, within the flowchart described in the third embodiment (FIG. 12), it is determined in step S204 whether the voltage error ΔV falls within the allowable range. The allowable range may be any value as long as it is possible to estimate the fact that lithium has been returned to a state that contributes to a battery reaction, and may be preset through an experiment, or the like.

When the voltage error ΔV exceeds the allowable range, it may be determined that lithium is in process of returning to a state that contributes to a battery reaction. In this case, the process from step S205 is not executed, and calculation of the open-circuit voltage curve (estimated value) and calculation of the voltage error ΔV are repeated until the voltage error ΔV falls within the allowable range. When the voltage error ΔV falls within the allowable range, it may be determined that lithium has been returned to a state that contributes to a battery reaction. In this case, the process from step S205 described in FIG. 12 may be executed.

The invention has been described with reference to example embodiments for illustrative purposes only. It should be understood that the description is not intended to be exhaustive or to limit form of the invention and that the invention may be adapted for use in other systems and applications. The scope of the invention embraces various modifications and equivalent arrangements that may be conceived by one skilled in the art.

The invention claimed is:

1. A degradation determination device that determines a degradation state of a lithium ion secondary battery, the degradation determination device comprising:
   a measuring unit that measures an open-circuit voltage characteristic that indicates a variation in open-circuit voltage with respect to a variation in capacity of the lithium ion secondary battery; and
   a determining unit that sets a parameter for identifying the open-circuit voltage characteristic, and that uses the parameter for identifying the open-circuit voltage characteristic that substantially coincides with the open-circuit voltage characteristic measured by the measuring unit to determine a degradation state due to wear and precipitation of lithium, wherein the parameter includes single electrode capacity retention rates that vary with degradation due to the wear and that are expressed by the mathematical expression (I) the capacity retention rate of a positive electrode equals a capacity of the positive electrode in a degradation state being divided by a capacity of the positive electrode in an initial state and (II) the capacity retention rate of a negative electrode equals a capacity of the negative electrode in a degradation state being divided by a capacity of the negative electrode in an initial state, and a battery capacity variation that varies with degradation due to the wear and the precipitation of lithium and that is expressed by the mathematical expression (III) the battery capacity variation equals a capacity of the negative electrode in a degradation state being multiplied by a shift of a negative electrode composition axis with respect to a positive electrode composition axis, wherein the battery capacity variation includes a first variation that corresponds to degradation due to the wear and a second variation that corresponds to degradation due to the precipitation of lithium, and the determining unit determines a precipitation state of the lithium using the second variation.

2. The degradation determination device according to claim 1, wherein the determining unit limits or prohibits charging of the lithium ion secondary battery in accordance with a precipitation state of the lithium.

3. The degradation determination device according to claim 1, wherein the determining unit identifies the first variation using a map that indicates a correspondence relationship among the first variation, the capacity retention rate of the positive electrode and the capacity retention rate of the negative electrode.

4. The degradation determination device according to claim 3, wherein the determining unit identifies a value obtained by subtracting the identified first variation from the battery capacity variation as the second variation.

5. The degradation determination device according to claim 1, wherein the determining unit identifies the open-circuit voltage characteristic that has a minimum voltage error and a minimum capacity error with respect to the open-circuit voltage characteristic measured by the measuring unit while varying the parameter.

6. The degradation determination device according to claim 5, wherein, when the voltage error exceeds an allowable range, the determining unit determines that precipitated lithium is in process of returning to a state that contributes to a battery reaction.

7. The degradation determination device according to claim 6, wherein the determining unit determines the degradation state when the voltage error falls within the allowable range.

8. A degradation determination method that determines a degradation state of a lithium ion secondary battery, the degradation determination method comprising:

measuring an open-circuit voltage characteristic that indicates a variation in open-circuit voltage with respect to a variation in capacity of the lithium ion secondary battery; and determining a degradation state due to wear and precipitation of lithium using a parameter for identifying the open-circuit voltage characteristic that substantially coincides with the measured open-circuit voltage characteristic, wherein the parameter includes single electrode capacity retention rates that vary with degradation due to the wear and that are expressed by the mathematical expression (IV) the capacity retention rate of a positive electrode equals a capacity of the positive electrode in a degradation state being divided by a capacity of the positive electrode in an initial state and (V) the capacity retention rate of a negative electrode equals a capacity of the negative electrode in a degradation state being divided by a capacity of the negative electrode in an initial state, and a battery capacity variation that varies with degradation due to the wear and the precipitation of lithium and that is expressed by the mathematical expression (VI) the battery capacity variation equals a capacity of the negative electrode in a degradation state being multiplied by a shift of a negative electrode composition axis with respect to a positive electrode composition axis, wherein the battery capacity variation includes a first variation that corresponds to degradation due to the wear and a second variation that corresponds to degradation due to the precipitation of lithium, and a precipitation state of the lithium is determined using the second variation.

9. The degradation determination method according to claim 8, wherein the first variation is identified using a map that indicates a correspondence relationship among the first variation, the capacity retention rate of the positive electrode and the capacity retention rate of the negative electrode.

10. The degradation determination method according to claim 9, wherein a value obtained by subtracting the identified first variation from the battery capacity variation is identified as the second variation.

11. The degradation determination method according to any one of claim 8, wherein the open-circuit voltage characteristic that has a minimum voltage error and a minimum capacity error with respect to the measured open-circuit voltage characteristic is identified while varying the parameter.

12. The degradation determination method according to claim 11, wherein, when the voltage error exceeds an allowable range, it is determined that precipitated lithium is in process of returning to a state that contributes to a battery reaction.

13. The degradation determination method according to claim 12, wherein the degradation state is determined when the voltage error falls within the allowable range.

* * * * *